(12) United States Patent
Vasudevan et al.

(10) Patent No.: US 10,290,752 B1
(45) Date of Patent: May 14, 2019

(54) METHODS OF DOPING SEMICONDUCTOR MATERIALS AND METASTABLE DOPED SEMICONDUCTOR MATERIALS PRODUCED THEREBY

(71) Applicant: ST3 LLC, Halethorpe, MD (US)

(72) Inventors: A. K. Vasudevan, Reston, VA (US); John J. Petrovic, Cape Canerval, FL (US); Timothy J. Langan, Catonsville, MD (US)

(73) Assignee: ST3 LLC, Halethorpe, MD (US)

( * ) Notice: Subject to any disclaimer, the term of this patent is extended or adjusted under 35 U.S.C. 154(b) by 0 days.

(21) Appl. No.: 15/586,943

(22) Filed: May 4, 2017

Related U.S. Application Data

(60) Provisional application No. 62/331,718, filed on May 4, 2016.

(51) Int. Cl.
*H01L 31/0288* (2006.01)
*H01L 31/18* (2006.01)
*H01L 21/261* (2006.01)
*C30B 31/20* (2006.01)
*G21H 1/02* (2006.01)

(52) U.S. Cl.
CPC ......... *H01L 31/0288* (2013.01); *C30B 31/20* (2013.01); *G21H 1/02* (2013.01); *H01L 21/261* (2013.01); *H01L 31/1804* (2013.01)

(58) Field of Classification Search
None
See application file for complete search history.

(56) References Cited

U.S. PATENT DOCUMENTS

| | | | | | |
|---|---|---|---|---|---|
| 4,027,051 | A | * | 5/1977 | Reuschel | C30B 31/20 |
| | | | | | 148/DIG. 165 |
| 4,129,463 | A | * | 12/1978 | Cleland | H01L 21/261 |
| | | | | | 136/258 |
| 4,277,307 | A | * | 7/1981 | Voss | C30B 29/06 |
| | | | | | 257/E21.324 |

(Continued)

OTHER PUBLICATIONS

Brosh et al., "Radiogenic silicon precipitates in neutron irradiated aluminum", Journal of Nuclear Materials, 306, (2002), pp. 173-179.

(Continued)

*Primary Examiner* — Katie L. Hammer
(74) *Attorney, Agent, or Firm* — Alan G. Towner; Leech Tishman Fuscaldo & Lampl

(57) ABSTRACT

The structures of base semiconductor materials such as Si are modified by the use of isotope transmutation alloying. A radioisotope such as $Si^{31}$ is added into a base semiconductor material such as Si, and the radioisotope is transformed to a transmuted form within the crystal lattice structure of the base semiconductor material. A master alloy comprising a relatively large amount of radioisotope such as $Si^{31}$ may initially be made, followed by introduction of the master alloy into the base semiconductor material. When $Si^{31}$ is used as the radioisotope, it may be transmuted into $P^{31}$ within an Si crystal lattice structure. Metastable semiconductor materials doped with otherwise insoluble amounts of selected dopants are produced as a result of the transmutation process.

12 Claims, 4 Drawing Sheets

(56) References Cited

U.S. PATENT DOCUMENTS

| | | | | |
|---|---|---|---|---|
| 4,910,156 | A * | 3/1990 | Takasu | C30B 31/20 148/DIG. 165 |
| 8,492,861 | B1 * | 7/2013 | Moosman | G21H 1/02 257/428 |
| 2004/0002202 | A1 * | 1/2004 | Horsky | H01L 21/26513 438/515 |
| 2007/0190761 | A1 * | 8/2007 | Dunkley | C30B 15/04 438/544 |

OTHER PUBLICATIONS

Farrell, "Microstructure and Tensile Properties of Heavily Irradiated 5052-0 Aluminum Alloy", Journal of Nuclear Materials, 97, North-Holland Publishing Company, (1981) pp. 33-43.

Farrell et al., "Transmutation-Produced Silicon Precipitates in Irradiated Aluminum", Metallography, 3, American Elsevier Publishing Company, Inc., (1970), pp. 275-284.

Haller, "Isotopically engineered semiconductors", Applied Physics Reviews, Lawrence Berkeley Laboratory and University of California, Berkeley, California, 23 pages.

Itoh et al., "Neutron transmutation doping of isotopically engineered Ge", Applied Physics Letters, 64, (16), Apr. 1984, pp. 2121-2123.

Jostsons et al, Transmutation-Produced Mg2Si Precipitation in an Irradiated A1-2.5% Mg Alloy, Scripta Metallurigica, vol. 6, 1972, Pergamon Press, Inc., pp. 447-452.

Liang et al., "Modeling of Thermodynamic Properties and Phase Equilibria of the Si—P System", Journal of Phase Equilibria and Diffusion, vol. 35, No. 1, 2014, pp. 24-35.

Petrovic et al., "The Possibility of Isotope Transmutation Alloying", Scripta Metallurgica, vol. 8, Pergamon Press, Inc., 1974, pp. 669-674.

Shlimak, "Neutron transmutation doping in semiconductors: science and applications", Physics of the Solid State, vol. 41, No. 5, May 1999, pp. 716-719.

* cited by examiner

Si-P phase diagram (b) Zone refining method

US 10,290,752 B1

METHODS OF DOPING SEMICONDUCTOR MATERIALS AND METASTABLE DOPED SEMICONDUCTOR MATERIALS PRODUCED THEREBY

CROSS-REFERENCE TO RELATED APPLICATION

This application claims the benefit of U.S. Provisional Patent Application Ser. No. 62/331,718 filed May 4, 2016, which is incorporated herein by reference.

FIELD OF THE INVENTION

The present invention relates to doped semiconductor materials, and more particularly relates to semiconductor materials such as silicon with dopants such as phosphorous that are formed by isotope transmutation processes.

BACKGROUND INFORMATION

Conventional semiconductor materials such as Si are doped with various elements to change their charge carrier properties. For example, N-type doped silicon materials may be coupled with P-typed doped silicon materials to form P—N junctions in devices such as solar cells. However, the types of elemental dopants that can be added to semiconductor materials are limited due to factors such as insolubility. For example, as demonstrated by a conventional Si—P phase diagram, P is only slightly soluble in Si at very high temperatures, e.g., 2.2 atomic percent solubility at 1,131° C., and P is considered insoluble in Si at lower temperatures such as room temperature.

SUMMARY OF THE INVENTION

The present invention provides methods for modifying the basic material lattice structure of semiconductor materials at the atomic level. One embodiment of the process involves modifying the distribution and number density of holes in these materials. The number density of holes is related to the efficiency of semiconducting properties such as electrical conductivity. Thus, the present processes may be used to modify properties of semiconductor materials.

In accordance with embodiments of the invention, the structure of a base semiconductor material such as Si may be modified by the use of isotope transmutation alloying. In this process, a radioisotope is added as an alloying solute into the molten base solvent material. The radioisotope may be selected such that solvent material properties are improved as a result of the transformation of the radioisotope into its transmuted form after the base semiconductor material has solidified. This property improvement results from the production of metastable thermodynamic state due to the result of the transmutation process.

An aspect of the present invention is to provide a method of making a silicon-based semiconductor material comprising introducing $Si^{31}$ radioisotope into molten Si, solidifying the Si and $Si^{31}$ radioisotope to form a transition material comprising atoms of the $Si^{31}$ radioisotope within a Si crystal lattice structure, and $P^{31}$ atoms retained in the Si crystal lattice structure to thereby form a metastable silicon-based semiconductor material doped with $P^{31}$.

Another aspect of the present invention is to provide a master alloy for use in making a silicon-based material doped with $P^{31}$, the master alloy comprising Si and $Si^{31}$ radioisotope wherein the $Si^{31}$ radioisotope is present in the master alloy in a greater amount than an amount of the $P^{31}$ contained in the silicon-based material.

A further aspect of the present invention is to provide a metastable silicon-based semiconductor material doped with $P^{31}$ transmuted from $Si^{31}$.

These and other aspects of the present invention will be more apparent from the following description.

DETAILED DESCRIPTION

Figure 1:
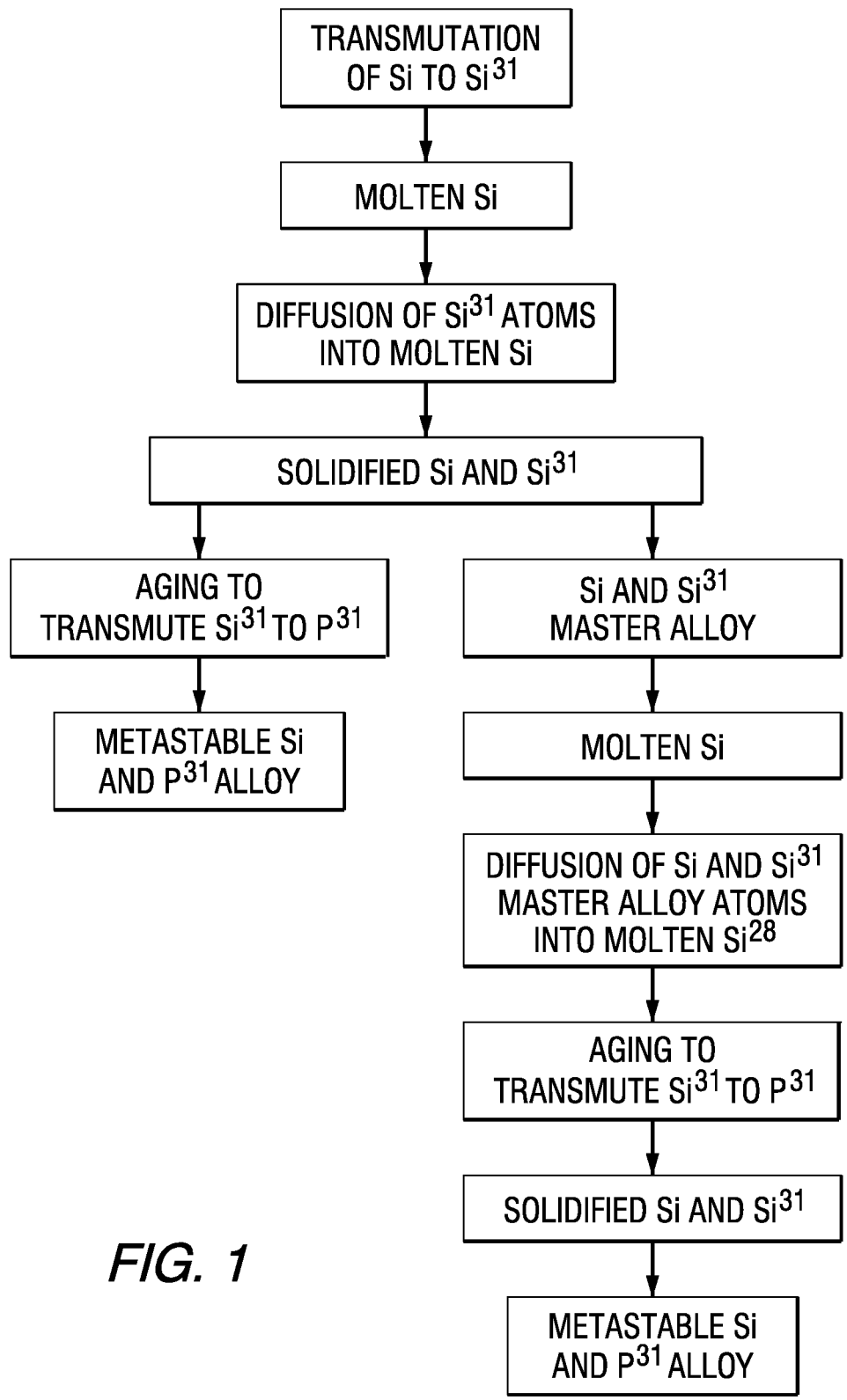
FIG. 1 is a schematic diagram illustrating methods of forming metastable Si doped with P in accordance with embodiments of the present invention.
Figure 2:
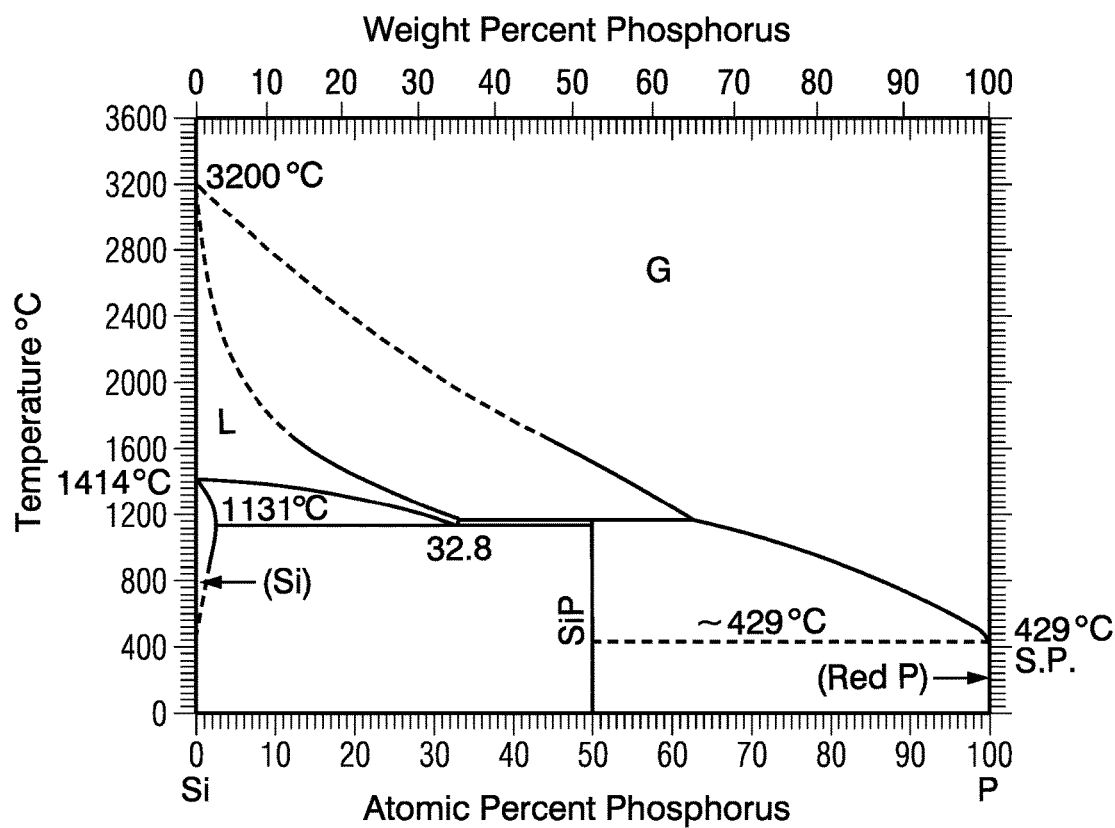
FIG. 2 is an Si—P phase diagram illustrating insolubility of P in Si at room temperature, and very limited solubility of P in Si within a relatively high temperature range.
Figure 3:
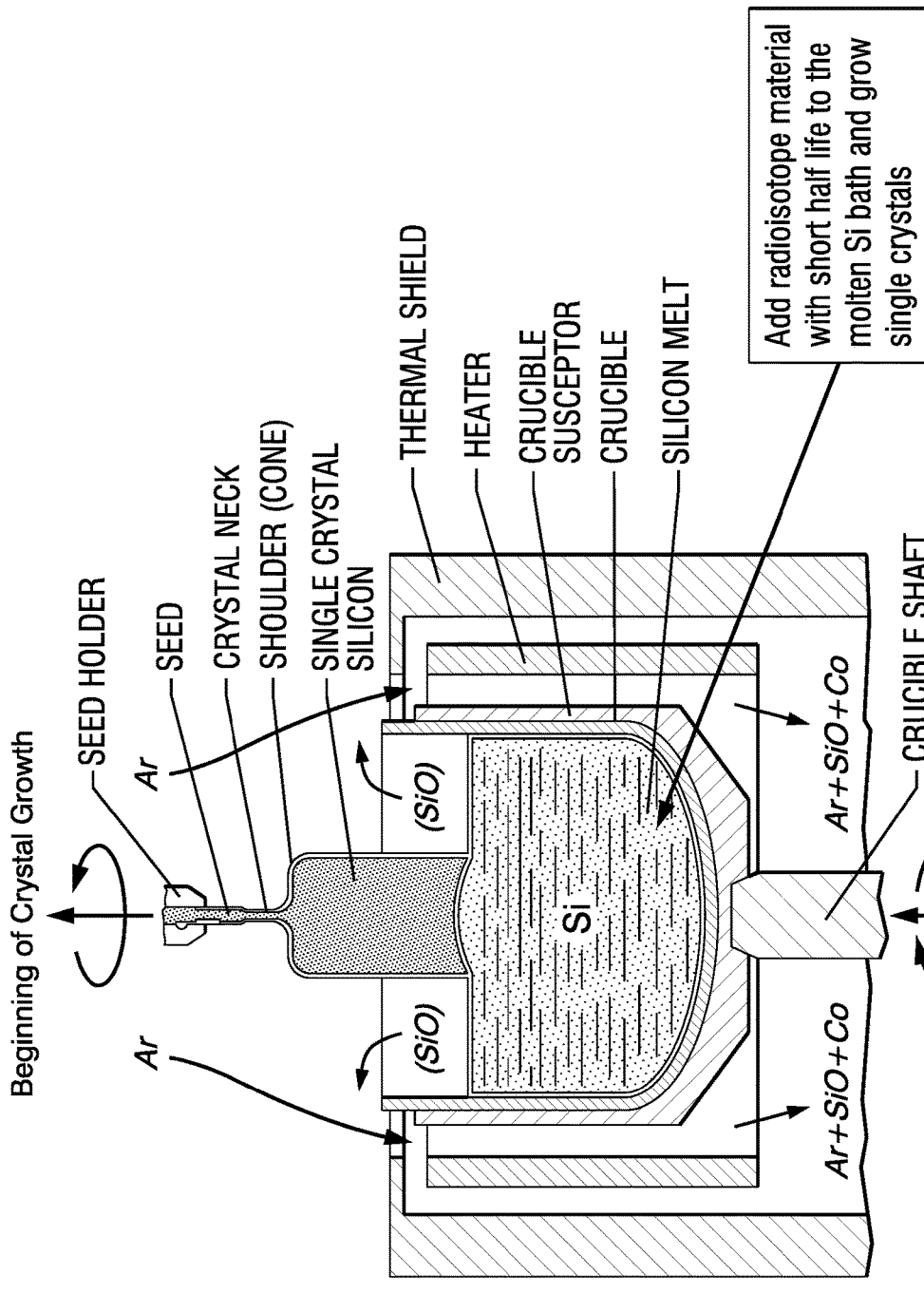
FIG. 3 is a schematic diagram illustrating growth of a solid single crystal Si material from a molten bath of Si to which radioisotope material may be added in accordance with an embodiment of the present invention.
Figure 4:
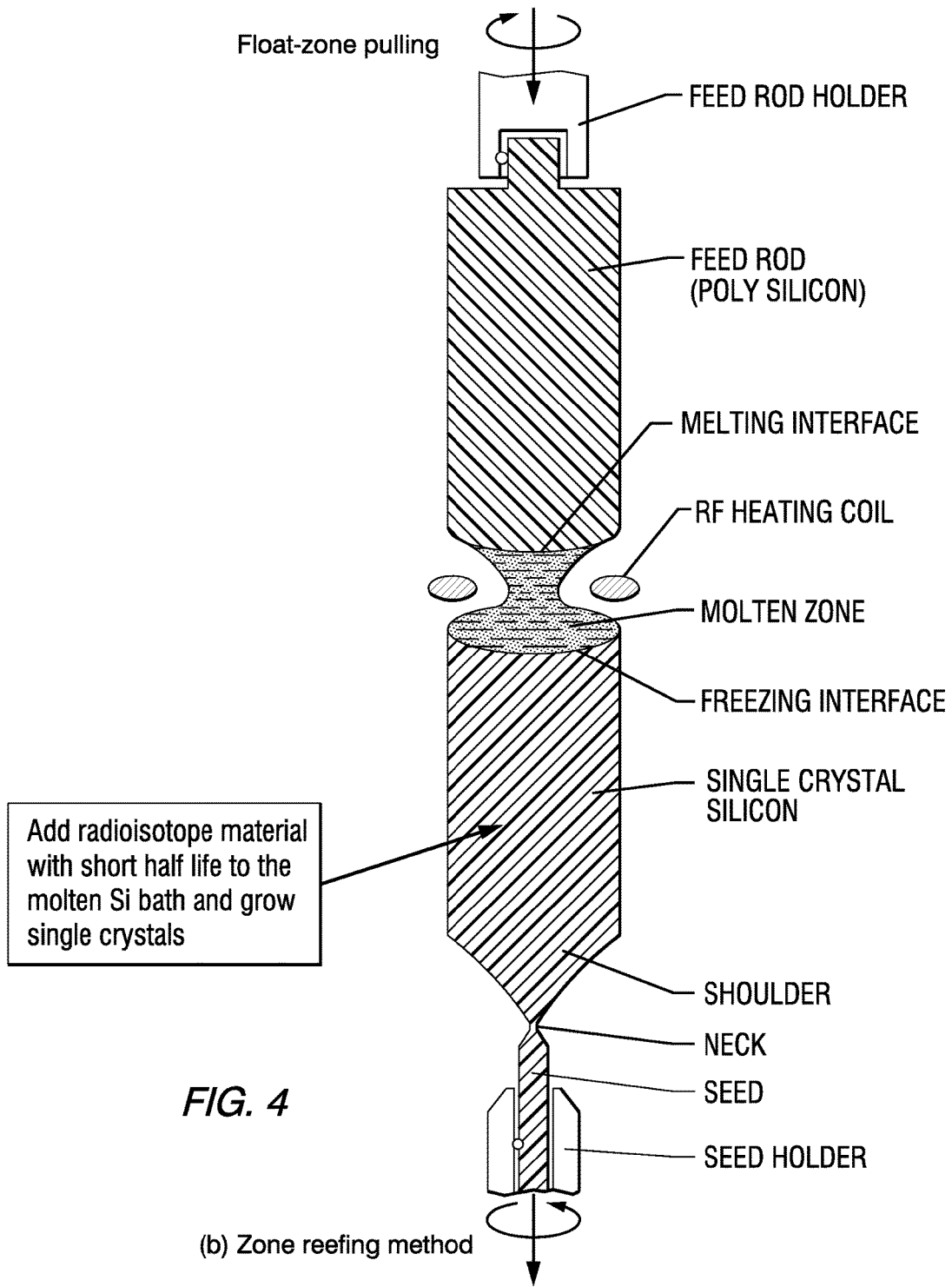
FIG. 4 is a schematic diagram illustrating growth of a solid single crystal Si material by a float-zone pulling process in which radioisotope material is added in accordance with an embodiment of the present invention.

FIG. 1 is a schematic diagram illustrating the production of metastable Si doped with P in accordance with embodiments of the present invention. As shown in FIG. 1, the radioisotope $Si^{31}$ is introduced into a molten semiconductor base material comprising Si. As used herein, "Si" means silicon in its standard isotope form, which predominantly comprises the $Si^{28}$ isotope. However, minor amounts of $Si^{29}$ and $Si^{30}$ isotopes may also be present in the Si. The $Si^{31}$ radioisotope may be introduced in solid form into the molten Si. Alternatively, solid $Si^{31}$ may be mixed with solid Si, followed by melting of the mixture to thereby allow the $Si^{31}$ radioisotope atoms to diffuse in the molten Si material.

As further shown in FIG. 1, the $Si^{31}$ radioisotope atoms easily diffuse into the molten Si base semiconductor material at a self diffusion rate that is the same for both $Si^{31}$ and Si. The relative amounts of Si and $Si^{31}$ may be selected such that essentially all of the $Si^{31}$ radioisotope atoms are soluble within the Si base semiconductor material at elevated temperatures and upon solidifying Si transforms to P and is frozen in the lattice at room temperature both the elevated temperature of the molten Si and upon solidification and cooling, e.g., to room temperature.

As shown in FIG. 1, upon solidification, the $Si^{31}$ atoms form a solid solution in the crystal lattice structure of the Si base semiconductor material. As the $Si^{31}$ radioisotope atoms transmute, they form $P^{31}$ atoms within the Si crystal structure. The $Si^{31}$ thus transmutes to $P^{31}$. A solid material comprising Si and $P^{31}$ is thereby formed in a metastable state. As used herein, the terms "metastable" and "metastable state" mean a material containing both stable Si and $Si^{31}$ radioisotope that is subsequently aged to transmute the $Si^{31}$ to $P^{31}$.

FIG. 1 also illustrates an alternative embodiment in which the Si and $Si^{31}$ are initially solidified to form a master alloy. The $Si/Si^{31}$ master alloy may be added to an additional amount of molten Si to thereby diffuse the Si and $Si^{31}$ atoms of the master alloy into the additional amount of molten Si. Upon solidification, the cooled material comprises $Si^{31}$ radioisotope atoms from the master alloy, Si atoms from the master alloy, and Si atoms from the additional amount of molten Si. The $Si^{31}$ radioisotope atoms then transmute into $P^{31}$ atoms to form a metastable solid material comprising $P^{31}$ atoms within the Si crystal lattice.

In the embodiments shown in FIG. 1, the final semiconductor material comprises Si having a face centered cubic crystal lattice structure in which $P^{31}$ atoms are substituted for Si atoms within the crystal lattice structure. The semiconductor material thus comprises phosphorous-substituted silicon within a face centered cubic crystal structure. In certain embodiments, the material may be provided in single crystal form, while in other embodiments the material may be polycrystalline. In certain embodiments, most or essentially all of the $P^{31}$ atoms occupy sites within the Si crystal structure, rather than forming as Si—P precipitates separate from the crystal structure. Thus, the majority of the $P^{31}$ atoms are substituted into the Si crystal structure rather than forming as precipitates. Typically, less than 10 atomic percent of the $P^{31}$ atoms form precipitates, for example, less than 5 atomic percent, less than 2 atomic percent, less than 1 atomic percent, or less than 0.1 atomic percent, or less than 0.01 percent, or less than 0.001 percent.

The metastable Si and $P^{31}$ semiconductor materials produced in the embodiments shown in FIG. 1 may include controlled amounts of $P^{31}$. In certain embodiments, the $P^{31}$ may comprise from 0.001% to 10% atomic percent of the Si/$P^{31}$ material. For example, the $P^{31}$ may comprise from 0.0001% to 20% atomic percent, or from 0.001% to 2.2% atomic percent, or from 0.01% to 1.5% atomic percent. In a particular embodiment, when the metastable Si/$P^{31}$ semiconductor material is used for solar cell applications, the amount of $P^{31}$ may comprise from 0.01% to 1% atomic percent. Table 1 below lists the ranges above.

TABLE 1

Amount of $P^{31}$ in Si Semiconductor Material (atomic percent)

| Ranges | $P^{31}$ | Si |
|---|---|---|
| A | 0.00001%-20% | balance |
| B | 0.001%-2.2% | balance |
| C | 0.01%-1.5% | balance |
| D | 0.01%-1% | balance |

To produce Si/$P^{31}$ semiconductor materials as described above, the amount of $Si^{31}$ radioisotope used to make such materials may correspond to the amounts of transmuted $P^{31}$ described above. Thus, the amounts of $Si^{31}$ added to the molten Si base material may be within the same ranges as the $P^{31}$ amounts listed in Table 1 above.

When master alloys are formed, the $P^{31}$ may comprise from 0.001% to 10% atomic percent of the Si/$P^{31}$ material. For example, the $P^{31}$ may comprise from 0.0001% to 20% atomic percent, or from 0.001% to 2.2% atomic percent, or from 0.01% to 1.5% atomic percent.

Table 2 below lists ranges of $Si^{31}$ radioisotope that may be used in Si/$Si^{31}$ master alloys in accordance with embodiments of the present invention. In certain embodiments, the amount of $Si^{31}$ in a master alloy may be up to 50%, for example, from 1 to 47%, or from 2 to 30%.

TABLE 2

Amount of $Si^{31}$ in Si Master Alloy (atomic percent)

| Ranges | $Si^{31}$ | Si |
|---|---|---|
| A | 0.005%-20% | balance |
| B | 0.01%-10% | balance |
| C | 0.05%-5% | balance |
| E | 0.05%-2% | balance |

In addition to Si and $P^{31}$, the metastable Si-based semiconductor materials produced in accordance with embodiments of the present invention may further include minor amounts of other elements such as Ge, Ga, As, B, Al, Se and the like.

The $Si^{31}$ radioisotope material may be produced by bombarding Si with high energy neutrons to create in-situ $Si^{31}$, for example, at room temperature or by bringing the Si up to a temperature close to the melting point of Si, e.g., either above or below the Si melting point. The neutron flux used during bombardment of the Si may typically range from $10^{10}$ to $10^{16}$ neutrons/cm·sec, or from $10^{11}$ to $10^{15}$ neutrons/cm²·sec, or from $10^{12}$ to $10^{14}$ neutrons/cm²·sec. The neutron bombardment may be carried out for a suitable period of time, for example, ranging from 1 second to 72 hours, or from 30 seconds to 48 hours, or from 1 minute to 24 hours, or from 30 minutes to 12 hours.

Radioisotope $Si^{31}$ material produced as described above may be added to the base Si semiconductor by adding the isotope $Si^{31}$ directly into molten Si, or by using a seed $Si^{31}$ material or master alloy, e.g., to grow single crystal Si in floating zone equipment. These methods may be set up in solid form before melting.

When an Si/$Si^{31}$ master alloy is used, it may be made in a similar manner as described above, except higher concentrations of $Si^{31}$ may be present in the master alloys, e.g., as described in Table 2 above.

Solidification of the molten Si/$Si^{31}$ material may be performed at slow cooling rates, e.g., 50° C./min to room temperature.

Transmutation of the $Si^{31}$ to $P^{31}$ within the solid Si material occurs in situ by aging the material for an appropriate amount of time. During aging, conversion of $Si^{31}$ to $P^{31}$ occurs within the Si lattice, which is retained in the same crystal structure.

Once the metastable Si and $P^{31}$ material has been formed, it may be fabricated into any suitable type of semiconductor device. For example, the metastable Si/$P^{31}$ material may be used as N-type materials in P—N junctions of semiconductor devices such as solar panels.

Although the $Si^{31}$ radioisotope is primarily described herein, it is to be understood that other types of radioisotopes may be generated and used in accordance with embodiments of the invention. In accordance with embodiments of the present invention, radioisotopes such as $Si^{31}$ described above may be selected based on specific criteria: the radioisotope should have solubility in the base material; the transmuted element derived from the radioisotope is insoluble or has limited solubility in the base semiconductor material; the radioisotope has a higher diffusion rate in the base semiconductor material than the transmuted element; the transmuted element derived from the radioisotope has a low diffusion rate in the base material; the radioisotope is selected based on the atom size of the transmuted element such that it induces atomic size mismatch stresses in the crystal lattice; the radioisotope is selected based on the position it takes in the crystal lattice before transmutation, e.g., a substitutional site or an interstitial site (octahedral or tetrahedral); the radioisotope is selected based on its cost, ease of manufacture and abundance; the radioisotope is selected based on its half-life; the radioisotope is selected based on energy imparted into the base material on decay; and the radioisotope is selected based on the need of the end point application.

Examples of radioisotopes selected for various types of base semiconductor materials in accordance with embodiments of the invention are listed in Table 3.

TABLE 3

Radioisotopes and Transmuted Elements

| Semiconductor | Isotope | Half Life | Transmuted Element |
|---|---|---|---|
| Si | $Si^{31}$ | 2.62 hours | $P^{31}$ |
| Ge—Ga | $Ge^{71}$ | 11 days | $Ga^{71}$ |
| Si—Ge | $Ge^{71}$ | 11 days | $Ga^{71}$ |
| Ge—Se | $Se^{73}$ | 120 days | $As^{75}$ |

While the present invention may include additional combinations of base semiconductor materials, radioisotopes and transmuted elements, the present description is primarily directed to a silicon-based semiconductor material comprising Si doped with $P^{31}$ transmuted from $S^{31}$ radioisotope. However, it is to be understood that other combinations are within the scope of the present invention. For example, the method can be extended to add any other isotope that will give as donor or as acceptor element to Si.

Consider a pure semiconductor like Si. The element P when added gives a donor impurity. Phase diagrams for Si—P indicate that P is soluble at about 2.2 atomic percent at 1,131° C., and is insoluble at room temperature. With this limited solubility, only limited numbers of holes can be produced. However, if the $Si^{31}$ radioisotope is doped into Si, it is possible to adjust to higher/lower number densities of holes.

The effect of adding radioisotope of $Si^{31}$ (solute) to the non-radioactive pure Si (solvent). $Si^{31}$ has a half-life of 2.62 hours and will decay to a transmutation product $P^{31}$ emitting $\beta^-$ radiation. If such an element $Si^{31}$ is added to a molten pure Si and the resulting alloy is cooled to room temperature the atoms will randomly distribute in the lattice of Si. These atoms will transmute in-situ into the atoms of the transmuted product $P^{31}$. Thus the transmuted product will be frozen in the lattice of Si. This method of forming a metastable solid solution of P in Si can exceed the equilibrium solubility of the alloy dictated by Si—P phase diagrams.

It is possible to estimate the charge carrier concentration and conductivity of Si doped with P (same as $P^{31}$) 0.1% at (P-concentration $C_P = 10^{-3}$) amount at room temperature. For this calculation we define the following parameters:

For solvent Si: density $\rho = 2330$ kg/m$^3$; at.wt.=28; lattice parameter $a = 5.43 \times 10^{-10}$ m; atomic volume of a unit Si cell$=a^3=1.6\times10^{-28}$ m$^3$; electron mobility $\mu_e = 0.15$ m$^2$/V-s; hole mobility $\mu_h = 0.05$ m$^2$V-s; energy gap $E_g = 1.2$ eV;

Proton charge $e=1.6\times10^{-19}$ C, Avagadro's # $A=6.02\times10^{23}$
$N_P$=charge carrier concentration; $N_{Si}$=# of Si atoms per unit volume; $n_c$=concentration electron charge in conduction band; $n_v$=concentration of holes in valance band.

$N_{Si}$=(8 atom in unit cell)/(cell volume)=$8/1.6\times10^{-28}=5\times10^{28}$/m$^3$ $N_P=N_{Si}\times C_P=5\times10^{28}\times10^{-3}=5\times10^{25}$/m$^3$=charge carrier concentration $n_c$, neglecting very small $n_v$.

For intrinsic semiconductors like Si, $n_c=n_v$.

With complete ionization of P in Si, the charge carrier concentration $n_c=N_P=5\times10^{25}$/m$^3$ for $P=10^{-3}$ concentration as an example.

We now calculate the conductivity (a) of Si/P semiconductor:

$$\sigma(Si/P)=N_P e\mu_e=(5\times10^{25}/m^3)\times(1.6\times10^{-19}C)\times(0.15\ m^2/V\text{-}s)=1.2\times10^5/\text{ohm-m}$$

The intrinsic carrier concentration ($n_i$) in pure Si refers to electron (or hole) concentration. Commonly accepted values of $n_i$ for Si is about $1.4\times10^{15}$/m$^3$. This value is significantly smaller than for Si/P $n_c=5\times10^{25}$/m$^3$ for P=0.1 at % concentration, by about $10^{10}$.

Intrinsic Si conductivity $\sigma_{Si}=n_i\cdot e[\mu_e+\mu_h]$, since $n_c=n_v$ for pure Si; hence:

$$\sigma_{Si}=1.4\times10^{15}\times1.6\times10^{-18}\times0.2=0.448\times10^{-3}=4.5\times10^{-4}/\text{ohm-m}$$

This number is fixed for Si.

This conductivity of Si is significantly smaller by about $10^9$ compared to Si/P alloy at a $P=10^{-3}$ concentration.

Thus the carrier concentration and its conductivity can be estimated, with the assumption of complete ionization of P in Si. The calculation suggests that isotope alloying of a semiconductor Si can be significantly improved with very small concentration of doping impurities like P. Deliberate additions of impurities to a solvent material in a controlled manner can allow charge concentrations to be tailored in order to improve conductivity to desired values needed for specific applications.

In accordance with certain embodiments, metastable silicon-based semiconductor material may typically have a conductivity of from $10^5$ to $10^{17}$ per ohms-m, for example, from $10^7$ to $10^{15}$, or from $10^9$ to $10^{13}$, or from $10^9$ to $10^{12}$.

In accordance with certain embodiments, metastable silicon-based semiconductor material may typically have a carrier concentration of from $10^{20}$ to $1040$/m$^3$, for example, from $10^{27}$ to $10^{33}$, or from $10^{29}$ to $10^{34}$, or from $10^{28}$ to $10^{34}$.

Various methods can be used to add the alloying radioisotope into the base metal solvent. These include: directly add the isotope into to molten base material, solidify and fabricate; surface coating of the isotope onto the base material and diffusing it into the base material at a desired temperature; thermal spray on the surface of the base material and diffuse it in; add the isotope to the seed crystal to grow the single crystals; powder blends of isotope with the desired base material, compact, sinter into a final wrought product; and mechanically alloy via ball milling method both the isotope and the base material.

The following example is intended to illustrate various aspects of the present invention, and are not intended to limit the scope of the invention.

EXAMPLE

An amount of Si is bombarded by a neutron flux at an energy level of from $10^{12}$ to $10^{14}$ neutrons cm$^2$·sec for a sufficient amount of time within 1 to 12 hours to change a desired percentage of the Si atoms to $Si^{31}$ radioisotope atoms, e.g., up to 50% conversion of the Si to $Si^{31}$. Bombardment with the neutron flux is conducted at any suitable temperature, including room temperature, or close to the melting point of Si, to form a master alloy. The resultant master alloy, in either solid or molten form, is added to base Si material, e.g., in a molten state. Upon cooling, a metastable material is formed comprising a standard Si crystal lattice containing $P^{31}$ atoms that have been transmitted from the $S^{31}$ radioisotope atoms.

In one embodiment of the invention, radioisotopes are added to semiconductor materials used to make photovoltaic cells. The radioisotope is selected based on its solubility and diffusivity in the semiconductor and based on the doping effectiveness of its transmutated product. Semiconductor materials may be N-type materials used to make up P—N junctions used in solar cells. For example, transmutation of $Si^{31}$ to $P^{31}$ over time results in increased efficiency of the photovoltaic cells (or other semiconductor devices).

In one example of the embodiment, a uniform distribution of phosphorous is formed in the lattice of silicon which may be used to make the N-type material in a P-N junction in a solar cell. Prior work showed that techniques such as diffusion do not provide a uniform distribution of dopant in silicon. More uniform distribution of dopants could be achieved using techniques such as neutron transmutation doping (NTD) but this technique requires that the material be exposed to a neutron flux which induces extensive damage to the silicon lattice.

In this example of the embodiment, the radioisotope $Si^{31}$ is mixed in a predetermined ratio with the Si in the molten bath used to grow the N-type silicon material. The Si radioisotope is totally soluble and will self-diffuse within the silicon lattice. Thus on solidification the $Si^{31}$ will be randomly distributed in the lattice. The $Si^{31}$ in the lattice decays to form $P^{31}$.

Thus, N-type silicon material with random-uniform distributions of phosphorous present in the lattice at predetermined concentrations can fabricated. Very little segregation of phosphorous is observed on grain boundaries if polycrystalline silicon is grown. Phosphorous concentrations of $10^{13}$ to $10^{18}$ atoms/cm$^3$ may be achieved using the approach. Thermal annealing treatments may not be required due to the uniform distribution of the dopant and the relative lack of damage induced by the process.

The N-type silicon fabricated as per this example may be coupled with a P-type silicon material to form a P-N junction in a solar cell device.

The disclosed process can be used to improve performance of semiconductor materials used in various applications. For example the efficiency of the following components can be improved: solar cells to improve its efficiency; metal oxide semiconductor chemical sensors; silicon crystals used in CPU; and high power electronic device components Whereas particular embodiments of this invention have been described above for purposes of illustration, it will be evident to those skilled in the art that numerous variations of the details of the present invention may be made without departing from the invention as defined in the appended claims.

What is claimed is:

1. A method of making a silicon-based semiconductor material comprising:
   introducing a master alloy comprising Si and $Si^{31}$ radioisotope into a base Si material to form a transition material comprising atoms of the $Si^{31}$ radioisotope within a Si crystal lattice structure; and
   aging the transition material to convert at least a portion of the $Si^{31}$ radioisotope atoms to $P^{31}$ atoms retained in the Si crystal lattice structure to thereby form a silicon-based material doped with $P^{31}$.

2. The method of claim 1, wherein the amount of $P^{31}$ in the silicon-based semiconductor material is above an equilibrium solubility limit of phosphorous in silicon as determined by a standard Si—P phase diagram.

3. The method of claim 2, wherein the equilibrium solubility limit is a room temperature solubility limit.

4. The method of claim 1, wherein the amount of $P^{31}$ retained in the Si crystal lattice structure is from 0.0001 to 40 atomic percent of the Si crystal lattice structure.

5. The method of claim 1, wherein the amount of $P^{31}$ retained in the Si crystal lattice structure is at least 0.001 atomic percent of the Si crystal lattice structure.

6. The method of claim 1, wherein the amount of $P^{31}$ retained in the Si crystal lattice structure is from 0.01 to 30 atomic percent of the Si crystal lattice structure.

7. The method of claim 1, wherein the master alloy is introduced into molten base Si material.

8. The method of claim 7, wherein the master alloy is introduced at a temperature above room temperature into the molten base Si material.

9. The method of claim 1, wherein the master alloy comprises from 0.005 to 50 atomic percent $Si^{31}$ radioisotope.

10. The method of claim 1, wherein the master alloy comprises from 0.05 to 40 atomic percent $Si^{31}$ radioisotope.

11. The method of claim 1, wherein the Si crystal lattice structure is face-centered-cubic, and the $P^{31}$ atoms randomly occupy sites within the face-centered-cubic structure.

12. The method of claim 1, wherein the silicon-based semiconductor material has a conductivity of from $10^5$ to $10^{17}$ per ohms·m.

* * * * *